United States Patent
Miyashita

(10) Patent No.: US 8,538,363 B2
(45) Date of Patent: Sep. 17, 2013

(54) SEMICONDUCTOR INTEGRATED CIRCUIT AND RADIO RECEIVER

(75) Inventor: Daisuke Miyashita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/423,472

(22) Filed: Mar. 19, 2012

(65) Prior Publication Data

US 2013/0137388 A1 May 30, 2013

(30) Foreign Application Priority Data

Nov. 29, 2011 (JP) ................................. 2011-260505

(51) Int. Cl.
*H04B 1/06* (2006.01)
*H04B 1/28* (2006.01)

(52) U.S. Cl.
USPC ..................... 455/232.1; 455/333; 455/240.1

(58) Field of Classification Search
USPC ........... 455/333, 136, 138, 219, 232.1, 240.1, 455/245.1
See application file for complete search history.

(56) References Cited

U.S. PATENT DOCUMENTS

| 6,662,003 | B2 * | 12/2003 | Elder et al. | 455/333 |
| 7,215,938 | B2 * | 5/2007 | Asayama et al. | 455/260 |
| 7,330,707 | B2 * | 2/2008 | Okanobu | 455/140 |
| 7,702,052 | B2 * | 4/2010 | Okada et al. | 375/347 |
| 7,728,668 | B2 * | 6/2010 | Okanobu | 330/254 |
| 7,848,716 | B2 * | 12/2010 | Furuya et al. | 455/114.2 |
| 8,315,584 | B2 * | 11/2012 | Oba | 455/310 |
| 2011/0026507 | A1 | 2/2011 | Katsube et al. | |

FOREIGN PATENT DOCUMENTS

JP 2011-35692 2/2011

* cited by examiner

*Primary Examiner* — Sonny Trinh

(74) *Attorney, Agent, or Firm* — Oblon, Spivak, McClelland, Maier & Neustadt, L.L.P.

(57) ABSTRACT

The first control circuit controls the gain of the variable gain amplifier circuit and the cut-off frequency of the first low-pass filter so as to keep constant a product of a transfer function of the variable gain amplifier circuit and a transfer function of the first low-pass filter. The second control circuit compares a level of the second feedback signal and a preset threshold value after completion of gain control of the variable gain amplifier circuit, the second control circuit inputting the signal outputted from the first low-pass filter, as the first feedback signal to the first terminal as long as the level of the second feedback signal is not lower than the threshold value, the second control circuit inputting the signal outputted from the second low-pass filter, as the first feedback signal to the first terminal.

20 Claims, 7 Drawing Sheets

SEMICONDUCTOR INTEGRATED CIRCUIT AND RADIO RECEIVER

CROSS-REFERENCE TO RELATED APPLICATION

This application is based upon and claims the benefit of priority from the prior Japanese Patent Application No. 2011-260505, filed on Nov. 29, 2011, the entire contents of which are incorporated herein by reference.

BACKGROUND

1. Field

Embodiments described herein relate generally to a semiconductor integrated circuit and a radio receiver.

2. Background Art

The superheterodyne system and the direct conversion system are generally known systems for converting a radio frequency (RF) signal to a baseband signal in the receiving circuit of a semiconductor integrated circuit used for radio communications of a cellular phone or the like.

DETAILED DESCRIPTION

Figure 1:
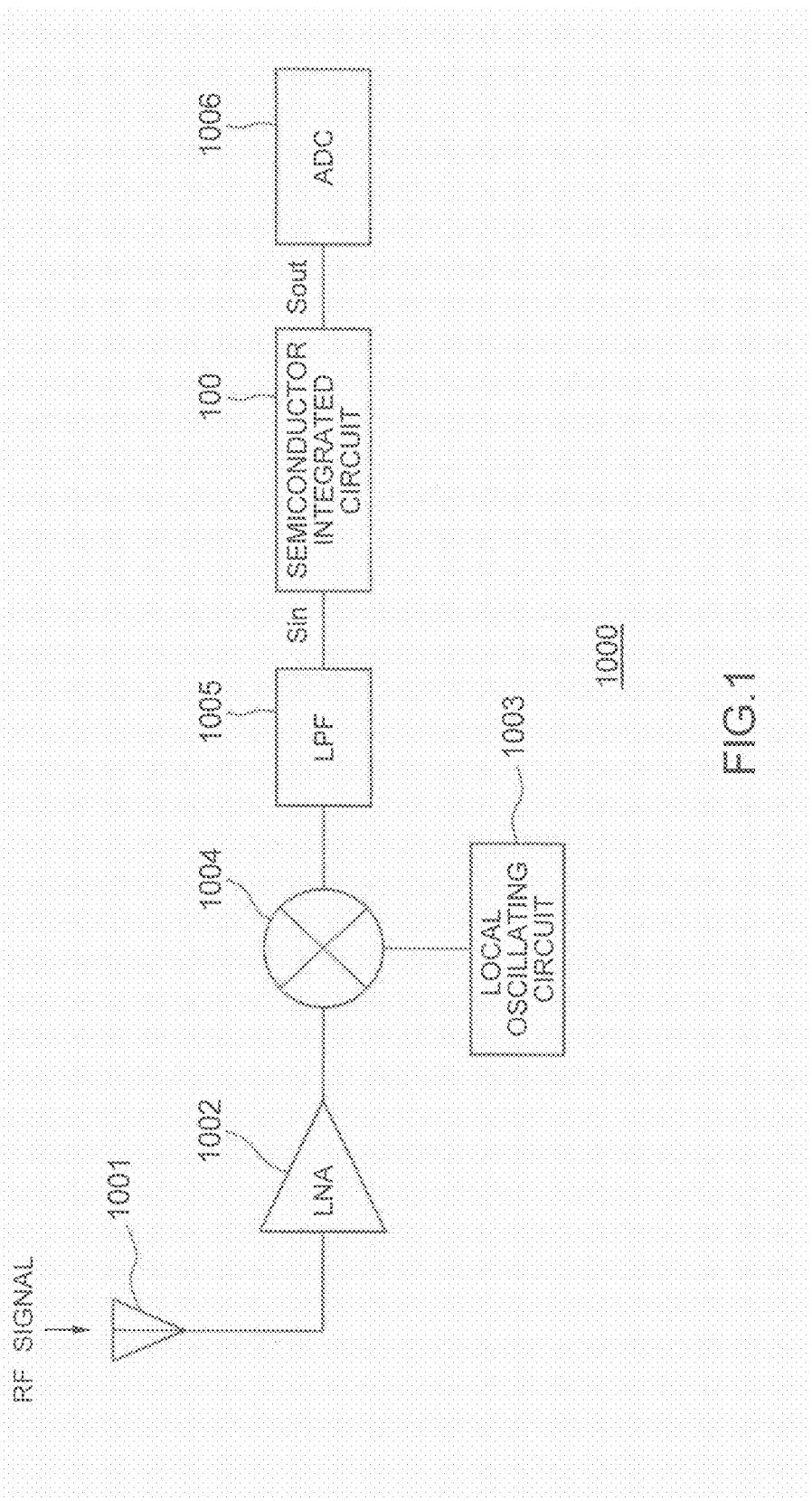
FIG. 1 is a block diagram illustrating an example of the configuration of a radio receiver 1000 according to a first embodiment.

A semiconductor integrated circuit according to an embodiment includes a first adder that outputs a first addition signal obtained by adding an input signal inputted to an input terminal and a first inverted signal obtained by inverting a first feedback signal outputted from a first terminal. The semiconductor integrated circuit includes a variable gain amplifier circuit that outputs an output signal obtained by amplifying the first addition signal to an output terminal, the variable gain amplifier circuit having a variable gain. The semiconductor integrated circuit includes a first low-pass filter that is fed with the output signal and outputs a signal obtained by filtering the output signal, the first low-pass filter having a variable cut-off frequency. The semiconductor integrated circuit includes a second low-pass filter that is fed with the output signal and outputs a signal obtained by filtering the output signal, the second low-pass filter having a lower cut-off frequency than that of the first low-pass filter. The semiconductor integrated circuit includes a second adder that outputs a second addition signal obtained by adding the input signal and a second inverted signal obtained by inverting a second feedback signal inputted to a second terminal. The semiconductor integrated circuit includes a third low-pass filter that is fed with the second addition signal and outputs a signal obtained by filtering the second addition signal, as the second feedback signal to the second terminal. The semiconductor integrated circuit includes a first control circuit that controls the gain of the variable gain amplifier circuit and the cut-off frequency of the first low-pass filter so as to keep constant a product of a transfer function of the variable gain amplifier circuit and a transfer function of the first low-pass filter. The semiconductor integrated circuit includes a second control circuit that compares a level of the second feedback signal and a preset threshold value after completion of gain control of the variable gain amplifier circuit, the second control circuit inputting the signal outputted from the first low-pass filter, as the first feedback signal to the first terminal as long as the level of the second feedback signal is not lower than the threshold value, the second control circuit inputting the signal outputted from the second low-pass filter, as the first feedback signal to the first terminal when the level of the second feedback signal falls below the threshold value.

For example, in the direct conversion system, flicker noise is generated and DC components are varied (DC offset) by self mixing of a mixer circuit and a mismatch of elements constituting the circuit. These factors in the direct conversion system may cause direct degradation of signals or may degrade circuit characteristics so as to indirectly degrade signals.

In order to solve the problem, generally, the low frequency components of signals are removed using high pass filters (HPFs).

In this case, an HPF having an extremely high cut-off frequency may lose information carried by a signal, leading to degradation of receiving performance.

Thus, a cut-off frequency is set at a low frequency that does not degrade receiving performance.

Furthermore, in a receiving circuit, high-speed gain control is demanded. The range of power (dynamic range) received by a receiver is extremely widened depending on, for example, a distance from the transmitter. When an RF signal is inputted to an AD converter circuit, the RF signal has to be adjusted to a predetermined signal amplitude. This is because a time for gain control is limited to obtain a high transmission rate.

In a typical receiver, a variation of gain changes the value of a DC offset generated by a mismatch of elements constituting a circuit. Thus, an extremely large DC offset may be obtained immediately after a change of gain. An HPF causes the DC offset to attenuate and converge after a while. At this point, a time constant is determined by the cut-off frequency of the HPF.

Thus, in the foregoing gain control at a low cut-off frequency, convergence of offset variations is extremely time-consuming, precluding high-speed gain control.

Hence, in a method of preventing degradation of receiving performance, the cut-off frequency of an HPF is set so high as to shorten a convergence time of DC offset variations during gain control and the cut-off frequency is reduced at the completion of the gain control.

However, in the case where cut-off frequencies are switched while a signal is received, a signal level at the time of switching causes a DC offset which slowly converges from that moment according to the response characteristics of an HPF having a low cut-off frequency.

Thus, unfortunately, a time for gain control may increase or the DC offset may be left at a time when DC offset variations should converge, leading to degradation of receiving performance.

The following embodiment will propose a semiconductor integrated circuit and a radio receiver that can achieve higher receiving performance.

The embodiment will be described below with reference to the accompanying drawings. For simple explanation, an LPF for realizing an HPF having a high cut-off frequency will be called a fast LPF and an LPF for realizing an HPF having a low cut-off frequency will be called a slow LPF. The LPFs are switched to switch HPF cut-off frequencies.

The cut-off frequency depends on a loop gain. Thus, when the gain of a variable gain amplifier circuit is changed, the gain of the high-speed LPF is also changed so as to prevent a change of the loop gain.

First Embodiment

FIG. 1 is a block diagram illustrating an example of the configuration of a radio receiver 1000 according to a first embodiment.

As illustrated in FIG. 1, the radio receiver 1000 includes a semiconductor integrated circuit 100, an antenna 1001, a low-noise amplifier circuit (LNA) 1002, a local oscillating circuit 1003, a mixer circuit 1004, a low-pass filter 1005, and an analog/digital converter circuit 1006.

The antenna 1001 receives an RF signal.

The low-noise amplifier circuit 1002 amplifies the received RF signal and outputs the signal.

The local oscillating circuit 1003 generates a local oscillation signal and outputs the signal.

The mixer circuit 1004 outputs a mixed signal of the signal outputted from the low-noise amplifier circuit 1003 and the local oscillation signal.

The low-pass filter 1005 filters the signal outputted from the mixer circuit 1004 and outputs the signal.

The semiconductor integrated circuit 100 amplifies the signal outputted from the low-pass filter 1005 and outputs the signal. The semiconductor integrated circuit 100 has a controllable gain.

The analog/digital converter circuit 1006 converts, to a digital signal, the signal outputted from the semiconductor integrated circuit 100.

Figure 2:
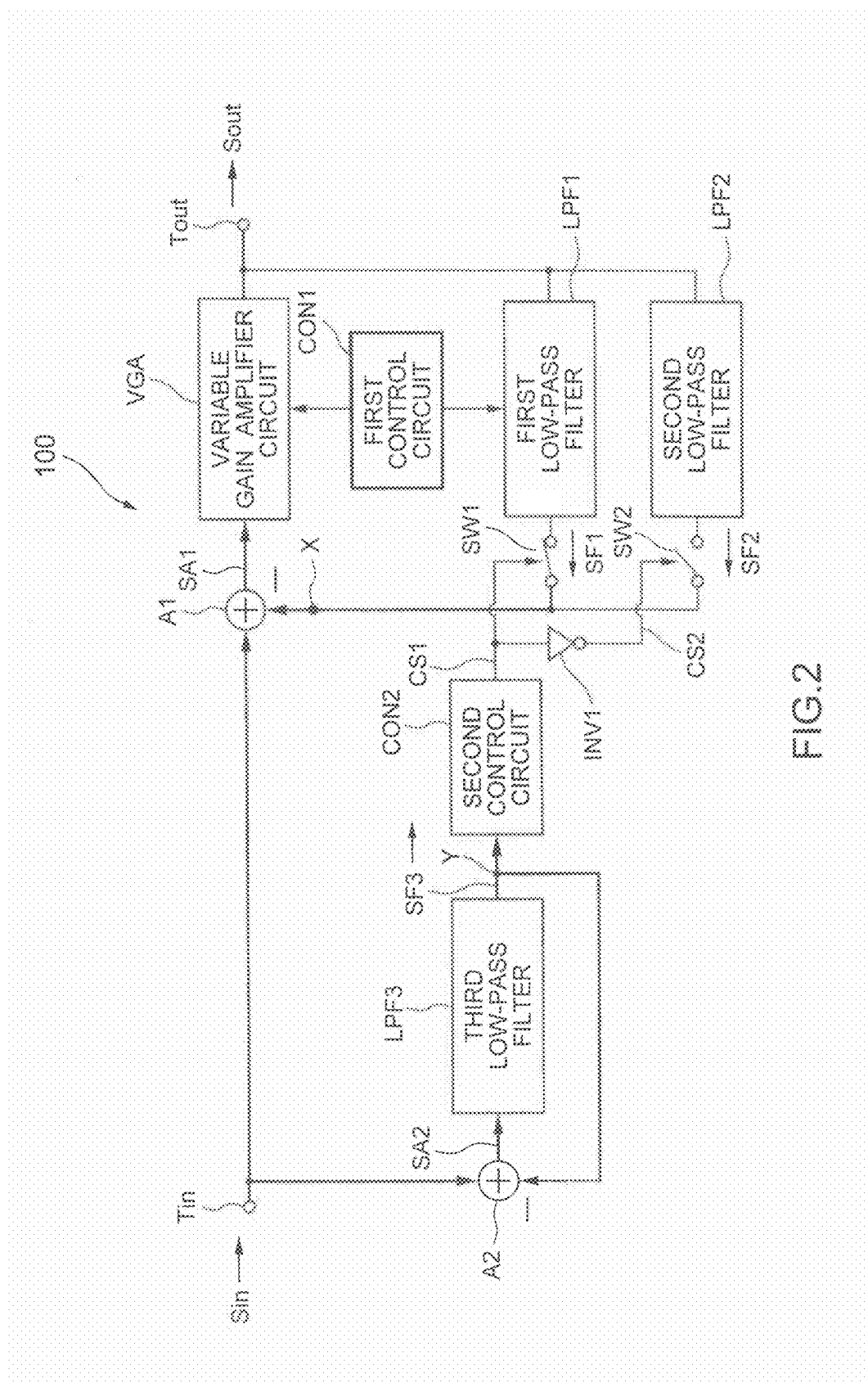
FIG. 2 is a block diagram illustrating an example of the configuration of the semiconductor integrated circuit 100 illustrated in FIG. 1.

FIG. 2 is a block diagram illustrating an example of the configuration of the semiconductor integrated circuit 100 illustrated in FIG. 1.

As illustrated in FIG. 2, the semiconductor integrated circuit 100 includes an input terminal Tin, an output terminal Tout, a first adder A1, a second adder A2, a variable gain amplifier circuit VGA, a first low-pass filter (fast LPF) F1, a second low-pass filter (slow LPF) F2, a third low-pass filter (fast LPF) F3, a first control circuit CON1, a second control circuit CON2, a first switch element SW1, a second switch element SW2, and an inverter INV.

The first adder A1 outputs a first addition signal SA1 that is obtained by adding an input signal Sin inputted to the input terminal Tin and a first inverted signal obtained by inverting a first feedback signal outputted from a first terminal X.

The variable gain amplifier circuit VGA outputs, to the output terminal Tout, an output signal Sout obtained by amplifying the first addition signal SA1. The variable gain amplifier circuit VGA has a variable gain.

The first low-pass filter LPF1 is fed with the output signal Sout and outputs a signal SF1 obtained by filtering the output signal Sout. The first low-pass filter LPF1 has a variable cut-off frequency.

The second low-pass filter F2 is fed with the output signal Sout and outputs a signal SF2 obtained by filtering the output signal Sout. The cut-off frequency of the second low-pass filter SF2 is set lower than that of the first low-pass filter LPF1.

The second adder A2 outputs a second addition signal SA2 that is obtained by adding the input signal Sin and a second inverted signal obtained by inverting a second feedback signal inputted to a second terminal Y.

The third low-pass filter LPF3 is fed with the second addition signal SA2 and outputs a signal SF3 as the second feedback signal to the second terminal Y. The signal SF3 is obtained by filtering the second addition signal SA2.

The gain of the third low-pass filter LPF3 is set equal to that of the first low-pass filter LPF1 when the gain of the variable gain amplifier circuit VGA is set at a minimum.

Moreover, a transfer function f3 of the third low-pass filter LPF3 is set equal to the product of a transfer function fv of the variable gain amplifier circuit VGA and a transfer function f1 of the first low-pass filter LPF1.

The first control circuit CON1 controls the gain of the variable gain amplifier circuit VGA and the cut-off frequency of the first low-pass filter LPF1 so as to keep constant a transfer function fin1 from the input terminal Tin to the first terminal X through the first low-pass filter LPF1 (i.e., to keep constant the product of the transfer function fv of the variable gain amplifier circuit VGA and the transfer function f1 of the first low-pass filter LPF1).

The first control circuit CON1 notifies the second control circuit CON2 that the gain control of the variable gain amplifier circuit VGA has completed.

The first switch element SW1 is connected between the first terminal X and the output of the first low-pass filter LPF1. The first switch element SW1 is turned on/off by the second control circuit CON2.

In the example of FIG. 2, the first switch element SW1 is controlled by a control signal CS1 outputted from the second control circuit CON2.

The second switch element SW2 is connected between the first terminal X and the output of the second low-pass filter LPF2. The second switch element SW2 is turned on/off by the second control circuit CON2.

In the example of FIG. 2, the second switch element SW2 is controlled by a control signal CS2 obtained by inverting, by means of the inverter INV, the control signal CS1 outputted from the second control circuit CON2.

In other words, the first switch element SW1 and the second switch element SW2 are controlled by the second control circuit CON2 so as to be complementarily turned on/off.

The second control circuit CON2 compares the level of the second feedback signal and a preset threshold value Vth after the completion of the gain control of the variable gain amplifier circuit VGA.

The second control circuit CON2 turns on the first switch element SW1 and turns off the second switch element SW2 as long as the level of the second feedback signal is not lower than the threshold value Vth during the gain control of the variable gain amplifier circuit VGA and after the completion of the gain control of the variable gain amplifier circuit VGA.

In other words, the second control circuit CON2 inputs the signal SF1, which is outputted from the first low-pass filter LPF1, as the first feedback signal to the first terminal X in a period during which the level of the second feedback signal is not lower than the threshold value Vth during the gain control of the variable gain amplifier circuit VGA and after the completion of the gain control of the variable gain amplifier circuit VGA.

The second control circuit CON2 turns off the first switch element SW1 and turns on the second switch element SW2 when the level of the second feedback signal falls below the threshold value Vth after the completion of the gain control of the variable gain amplifier circuit VGA. After that, this state is maintained even if the level of the second feedback signal exceeds the threshold value Vth.

In other words, the second control circuit CON2 keeps inputting the signal SF2, which is outputted from the second low-pass filter LPF2, as the first feedback signal to the first terminal X in the case where the level of the second feedback signal falls below the threshold value Vth once after the completion of the gain control of the variable gain amplifier circuit VGA.

Figure 3:
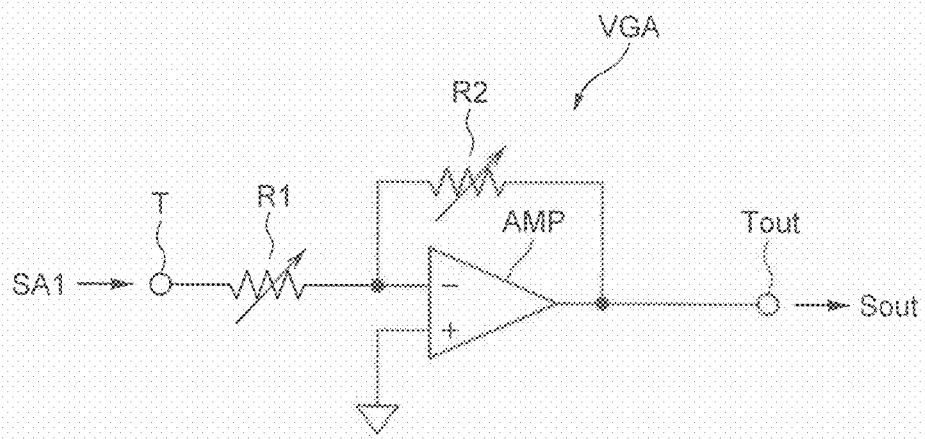
FIG. 3 is a circuit diagram illustrating an example of the configuration of the variable gain amplifier circuit VGA illustrated in FIG. 2.

FIG. 3 is a circuit diagram illustrating an example of the configuration of the variable gain amplifier circuit VGA illustrated in FIG. 2.

As illustrated in FIG. 3, the variable gain amplifier circuit VGA includes, for example, a first variable resistor R1, a second variable resistor R2, and an amplifier circuit AMP.

The first variable resistor R1 has one end connected to the output (terminal T) of the first adder A1.

The amplifier circuit AMP has an inverting Input terminal connected to the other end of the first variable resistor R1, a non-inverting input terminal connected to ground, and an output connected to the output terminal Tout.

The second variable resistor R2 has one end connected to the inverting input terminal of the amplifier circuit AMP and the other end connected to the output of the amplifier circuit AMP.

In this configuration, the first control circuit CON1 controls the transfer function fv of the variable gain amplifier circuit VGA by controlling the resistance value of the first variable resistor R1 and the resistance value of the second variable resistor R2.

Figure 4:
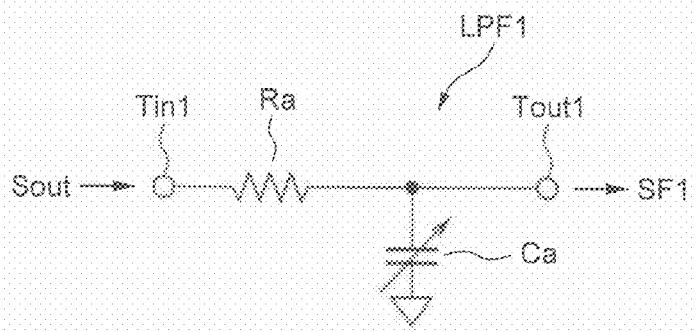
FIG. 4 is a circuit diagram illustrating an example of the configuration of the first low-pass filter LPF1 illustrated in FIG. 2.

FIG. 4 is a circuit diagram illustrating an example of the configuration of the first low-pass filter LPF1 illustrated in FIG. 2.

As illustrated in FIG. 4, the first low-pass filter LPF1 includes, for example, a first resistor Ra and a variable capacitor Ca.

The first resistor Ra has one end connected to a terminal Tin1 fed with the output signal Sout and has the other end connected to a terminal Tout1 for outputting the signal SF1 obtained by filtering the output signal Sout. The first resistor Ra may further include a buffer connected between the terminal Tin1 and the one end of the first resistor Ra.

The variable capacitor Ca is connected between the other end of the first resistor Ra and the ground.

In this configuration, the first control circuit CON1 controls the cut-off frequency (transfer function f1) of the low-pass filter LPF1 by controlling the capacitance value of the variable capacitor Ca.

Figure 5:
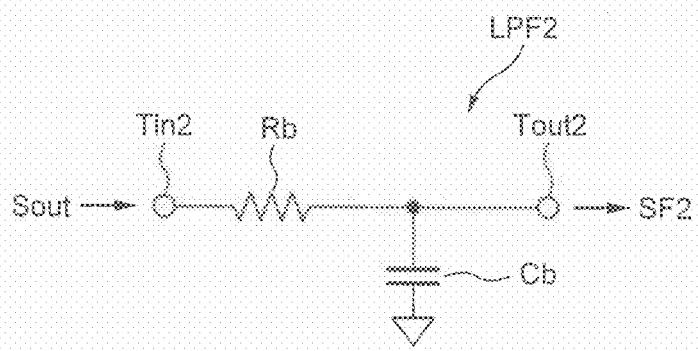
FIG. 5 is a circuit diagram illustrating an example of the configuration of the second low-pass filter LPF2 illustrated in FIG. 2.

FIG. 5 is a circuit diagram illustrating an example of the configuration of the second low-pass filter LPF2 illustrated in FIG. 2.

As illustrated in FIG. 5, the second low-pass filter LPF2 includes, for example, a second resistor Rb and a first capacitor Cb.

The second resistor Rb has one end connected to a terminal Tin2 fed with the output signal Sout and has the other end connected to a terminal Tout2 for outputting the signal SF2 obtained by filtering the output signal Sout. The second resistor Rb may further include a buffer connected between the terminal Tin2 and the one end of the second resistor Rb.

The first capacitor Cb is connected between the other end of the second resistor Rb and the ground.

Figure 6:
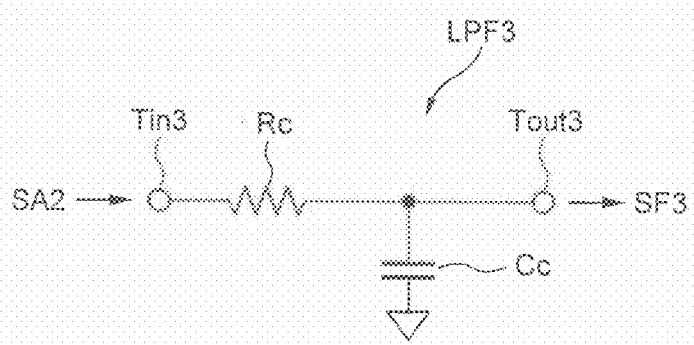
FIG. 6 is a circuit diagram illustrating an example of the configuration of the third low-pass filter LPF3 illustrated in FIG. 2.

FIG. 6 is a circuit diagram illustrating an example of the configuration of the third low-pass filter LPF3 illustrated in FIG. 2.

As illustrated in FIG. 6, the third low-pass filter LPF3 includes, for example, a third resistor Rc and a second capacitor Cc.

The third resistor Rc has one end connected to a terminal Tin3 fed with the second addition signal SA2 and the other end connected to a terminal Tout3 for outputting the signal SF3 obtained by filtering the output signal Sout.

The second capacitor Cc is connected between the other end of the third resistor Rc and the ground.

As described above, the gain of the third low-pass filter LPF3 is set equal to that of the first low-pass filter LPF1 when the gain of the variable gain amplifier circuit VGA is set at the minimum.

In this case, the cut-off frequency of the third low-pass filter LPF3 can be set higher. Specifically, the product of the capacitance value of the second capacitor Cc and the resistance value of the third resistor Rc can be reduced, allowing the semiconductor integrated circuit 100 to have a smaller circuit area.

In the semiconductor integrated circuit 100 configured thus, the transfer function from the input to the output serves as an HPF characteristic and a cut-off frequency is determined by a loop gain and the cut-off frequency of an LPF when the overall circuit is viewed as an HPF. The value of the cut-off frequency is changed to obtain HPF characteristics at a high cut-off frequency and HPF characteristics at a low cut-off frequency.

The following will discuss characteristics for switching the cut-off frequencies of the semiconductor integrated circuit 100 having the foregoing configuration and functions.

As described above, in order to improve receiving performance, a DC offset caused by the input signal Sin needs to be suppressed when the cut-off frequencies are switched.

A larger DC offset occurs if the cut-off frequencies are switched when the first terminal X has a higher signal level.

Thus, in the present embodiment, the cut-off frequencies are switched when the first terminal X has a low signal level.

In this case, the signal of the first terminal X also contains DC components for correcting the DC offset of the variable gain amplifier circuit VGA. Hence, for comparison of the level of the input signal Sin, the number of DC components needs to be recognized.

In the present embodiment, as described above, the third low-pass filter LPF3 and the second control circuit CON2 (FIG. 2) are used to detect the level of the signal SF1 at the first terminal X when the effect of a DC offset in the circuit is eliminated.

The input signal Sin is inputted to the additional third low-pass filter LPF3 as well as an ordinary signal path. As described above, the third low-pass filter LPF3 has the same characteristics as the first low-pass filter LPF1 that removes a DC offset of a signal path when the gain of the variable gain amplifier circuit VGA is, for example, equal to a minimum gain of 0 dB (1 time).

The transfer function fin2 from the input terminal Tin to the second terminal Y is expressed by equation (1) below.

$$fin2 = f3/(1+f3) \quad (1)$$

The transfer function fin2 is equal to the transfer function fin1 from the input to the first terminal X. The transfer function fin1 is expressed by equation (2) below.

$$fin1 = f1 \times fv/(1+f1 \times fv) \quad (2)$$

The gain of the first low-pass filter LPF1 is controlled by the first control circuit CON1 concurrently with the gain of the variable gain amplifier circuit VGA to prevent a change of the loop gain. As described above, for example, the gain of the third low-pass filter LPF3 is equal to the gain of the first low-pass filter LPF1 when the gain of the variable gain amplifier circuit VGA is 0 dB (1 time).

Figure 7:
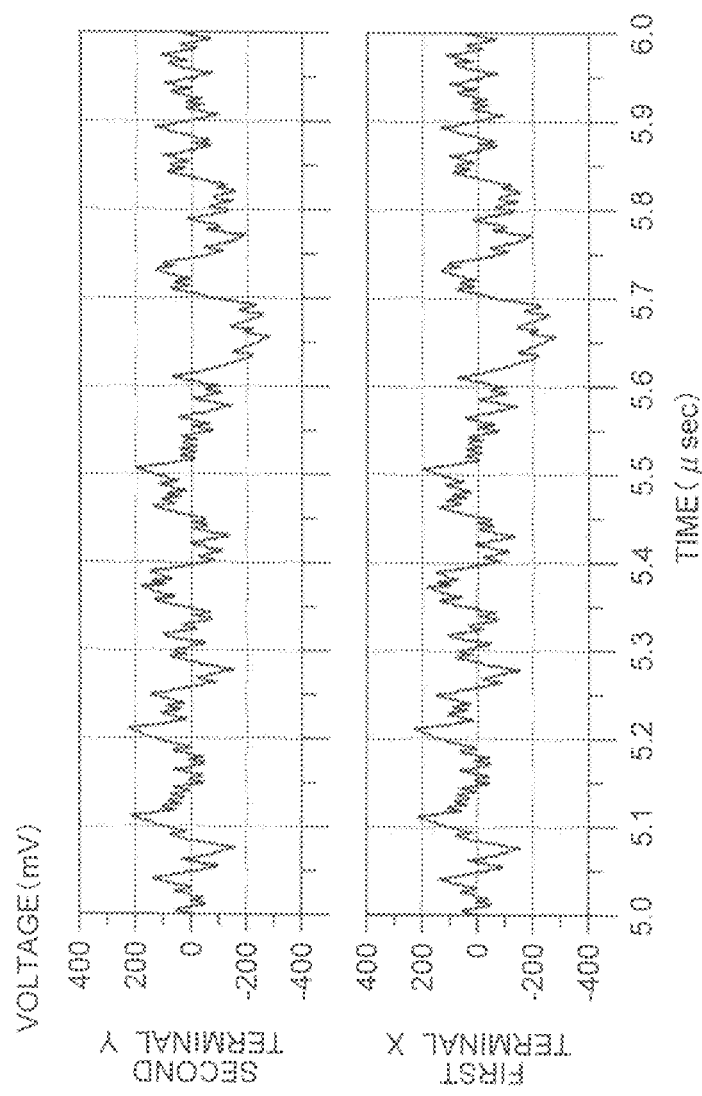
FIG. 7 shows waveform simulation results of the signal SF1 at the first terminal X and the signal SF3 at the second terminal Y when a modulating signal is inputted under ideal conditions in which the signal path does not have a DC offset and DC offset variations are not found in the time of gain variations.

FIG. 7 shows waveform simulation results of the signal SF1 at the first terminal X and the signal SF3 at the second terminal Y when a modulating signal is inputted under ideal conditions in which the signal path does not have a DC offset and DC offset variations are not found in the time of gain variations.

As shown in FIG. 7, the waveform of the signal SF1 at the first terminal X and the waveform of the signal SF3 at the second terminal Y are identical to each other.

Thus, the signal SF3 at the second terminal Y can be used for detecting the level of the signal SF1. The influence of a DC offset is negligible in the case where the variable gain amplifier circuit VGA dominantly acts as, for example, a source of a DC offset and an input node has a low DC offset. In the case where the influence of a DC offset is not negligible, DC components may be removed on the input of the third low-pass filter LPF3 by an HPF with a low cut-off frequency.

This is because gain control does not cause DC offset variations and thus convergence over a long time is acceptable. If sufficient convergence is obtained at the switching of cut-off frequencies, no problems occur.

As described above, the second control circuit CON2 monitors the level of the second feedback signal at the second terminal Y. In the case where the level of the second feedback signal is higher than the threshold value Vth, the second control circuit CON2 turns on the first switch element SW1 and turns off the second switch element SW2.

Specifically, in the case where the level of the second feedback signal is higher than the threshold value Vth, the second control circuit CON2 inputs the signal SF1 outputted from the first low-pass filter LPF1, as the first feedback signal to the first terminal X.

Then, the second control circuit CON2 monitors the level of the second feedback signal at the second terminal Y. When the signal level falls below the threshold value Vth for the first time after the completion of the gain control of the variable gain amplifier circuit VGA, the second control circuit CON2 outputs a signal CS1 for switching cut-off frequencies.

In other words, in the case where the level of the second feedback signal is lower than the threshold value Vth, the second control circuit CON2 inputs the signal SF2 outputted from the second low-pass filter LPF2, as the first feedback signal to the first terminal X.

Figure 8:
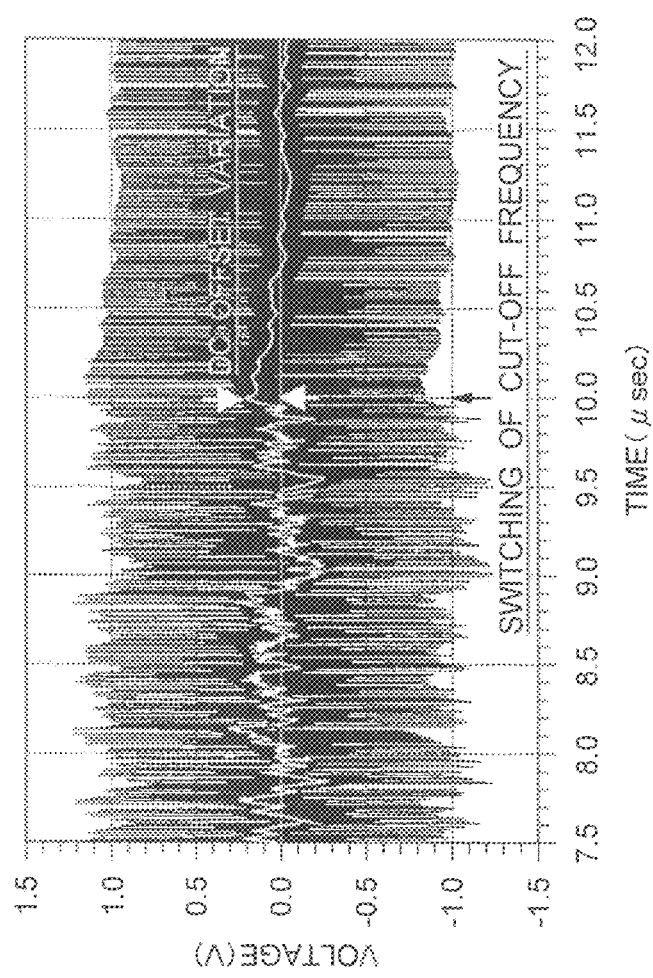
FIG. 8 is a waveform chart of a comparative example in which cut-off frequencies are switched at a high input signal level.
Figure 9:
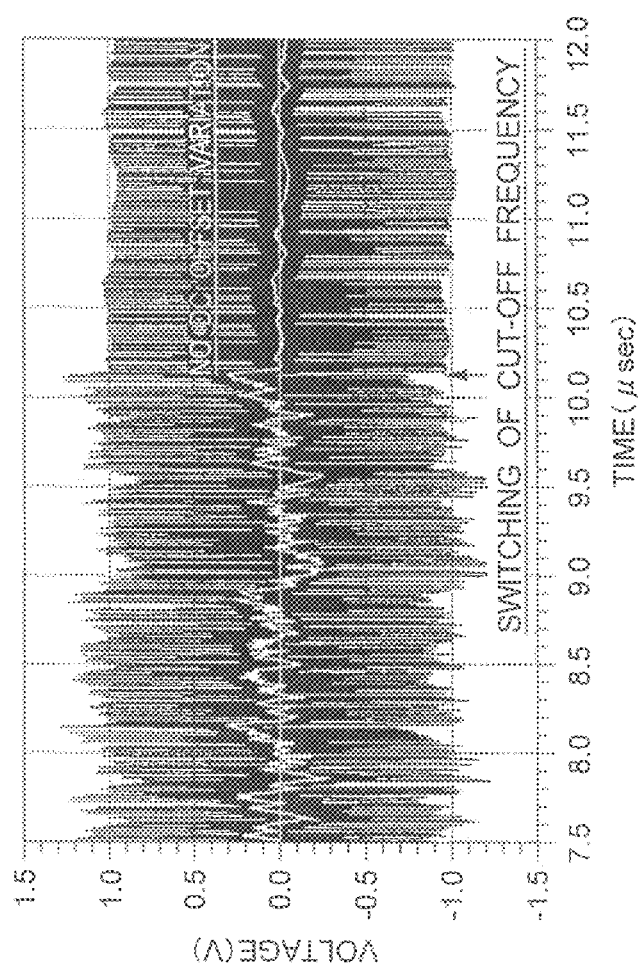
FIG. 9 is a waveform chart of the output signal of the semiconductor integrated circuit 100 according to the first embodiment.

FIG. 8 is a waveform chart of a comparative example in which cut-off frequencies are switched at a high input signal level. FIG. 9 is a waveform chart of the output signal of the semiconductor integrated circuit 100 according to the first embodiment.

As shown in FIG. 8, in the comparative example, the influence of an input signal causes large DC offset variations.

In the semiconductor integrated circuit 100 according to the first embodiment, as shown in FIG. 9, cut-off frequencies are switched at a low input signal level, so that DC offset variations do not occur.

In other words, the semiconductor integrated circuit 100 according to the present embodiment automatically adjusts timing for switching cut-off frequencies in response to an input signal, thereby preventing a received signal from causing a DC offset and achieving faster gain control.

As described above, the semiconductor integrated circuit according to the present embodiment can improve receiving performance.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a first adder that outputs a first addition signal obtained by adding an input signal inputted to an input terminal and a first inverted signal obtained by inverting a first feedback signal outputted from a first terminal;
   a variable gain amplifier circuit that outputs an output signal obtained by amplifying the first addition signal to an output terminal, the variable gain amplifier circuit having a variable gain;
   a first low-pass filter that is fed with the output signal and outputs a signal obtained by filtering the output signal, the first low-pass filter having a variable cut-off frequency;
   a second low-pass filter that is fed with the output signal and outputs a signal obtained by filtering the output signal, the second low-pass filter having a lower cut-off frequency than that of the first low-pass filter;
   a second adder that outputs a second addition signal obtained by adding the input signal and a second inverted signal obtained by inverting a second feedback signal inputted to a second terminal;
   a third low-pass filter that is fed with the second addition signal and outputs a signal obtained by filtering the second addition signal, as the second feedback signal to the second terminal;
   a first control circuit that controls the gain of the variable gain amplifier circuit and the cut-off frequency of the first low-pass filter so as to keep constant a product of a transfer function of the variable gain amplifier circuit and a transfer function of the first low-pass filter; and
   a second control circuit that compares a level of the second feedback signal and a preset threshold value after completion of gain control of the variable gain amplifier circuit, the second control circuit inputting the signal outputted from the first low-pass filter, as the first feedback signal to the first terminal as long as the level of the second feedback signal is not lower than the threshold value, the second control circuit inputting the signal outputted from the second low-pass filter, as the first feedback signal to the first terminal when the level of the second feedback signal falls below the threshold value.

2. The semiconductor integrated circuit according to claim 1, wherein in the case where the level of the second feedback signal falls below the threshold value once after the completion of the gain control of the variable gain amplifier circuit, the second control circuit keeps inputting the signal outputted from the second low-pass filter, as the first feedback signal to the first terminal.

3. The semiconductor integrated circuit according to claim 2, wherein the third low-pass filter has a gain that is set equal to a gain of the first low-pass filter when the gain of the variable gain amplifier circuit is set at a minimum.

4. The semiconductor integrated circuit according to claim 2, further comprising a first switch element that is connected between the first terminal and an output of the first low-pass filter and is turned on/off by the second control circuit; and a second switch element that is connected between the first terminal and an output of the second low-pass filter and is turned on/off by the second control circuit, wherein the second control circuit turns on the first switch element and turns off the second switch element in the case where the level of the second feedback signal is higher than the threshold value, and the second control circuit turns off the first switch element and turns on the second switch element in the case where the level of the second feedback signal is lower than the threshold value.

5. The semiconductor integrated circuit according to claim 2, wherein the third low-pass filter comprises:

a third resistor having a first end connected to a terminal fed with the second addition signal and a second end connected to a terminal for outputting the signal obtained by filtering the output signal; and a second capacitor connected between the second end of the third resistor and ground.

6. The semiconductor integrated circuit according to claim 1, wherein the third low-pass filter has a gain that is set equal to a gain of the first low-pass filter when the gain of the variable gain amplifier circuit is set at a minimum.

7. The semiconductor integrated circuit according to claim 6, further comprising a first switch element that is connected between the first terminal and an output of the first low-pass filter and is turned on/off by the second control circuit; and a second switch element that is connected between the first terminal and an output of the second low-pass filter and is turned on/off by the second control circuit, wherein the second control circuit turns on the first switch element and turns off the second switch element in the case where the level of the second feedback signal is higher than the threshold value, and the second control circuit turns off the first switch element and turns on the second switch element in the case where the level of the second feedback signal is lower than the threshold value.

8. The semiconductor integrated circuit according to claim 6, wherein the third low-pass filter comprises:

a third resistor having a first end connected to a terminal fed with the second addition signal and a second end connected to a terminal for outputting the signal obtained by filtering the output signal; and a second capacitor connected between the second end of the third resistor and ground.

9. The semiconductor integrated circuit according to claim 1, further comprising a first switch element that is connected between the first terminal and an output of the first low-pass filter and is turned on/off by the second control circuit; and a second switch element that is connected between the first terminal and an output of the second low-pass filter and is turned on/off by the second control circuit, wherein the second control circuit turns on the first switch element and turns off the second switch element in the case where the level of the second feedback signal is higher than the threshold value, and the second control circuit turns off the first switch element and turns on the second switch element in the case where the level of the second feedback signal is lower than the threshold value.

10. The semiconductor integrated circuit according to claim 1, wherein the third low-pass filter comprises:

a third resistor having a first end connected to a terminal fed with the second addition signal and a second end connected to a terminal for outputting the signal obtained by filtering the output signal; and a second capacitor connected between the second end of the third resistor and ground.

11. A radio receiver comprising:

an antenna that receives an RF signal;

a low-noise amplifier circuit that amplifies the received RF signal and outputs the signal;

a local oscillating circuit that generates a local oscillation signal;

a mixer circuit that outputs a mixed signal of the signal outputted from the low-noise amplifier circuit and the local oscillation signal;

a low-pass filter that filters the signal outputted from the mixer circuit and outputs the signal;

a semiconductor integrated circuit that amplifies the signal outputted from the low-pass filter and outputs the signal, the semiconductor integrated circuit having a controllable gain; and an analog/digital converter circuit that converts, to a digital signal, the signal outputted from the semiconductor integrated circuit, wherein the semiconductor integrated circuit comprising:

a first adder that outputs a first addition signal obtained by adding an input signal inputted to an input terminal and a first inverted signal obtained by inverting a first feedback signal outputted from a first terminal;

a variable gain amplifier circuit that outputs an output signal obtained by amplifying the first addition signal to an output terminal, the variable gain amplifier circuit having a variable gain;

a first low-pass filter that is fed with the output signal and outputs a signal obtained by filtering the output signal, the first low-pass filter having a variable cut-off frequency;

a second low-pass filter that is fed with the output signal and outputs a signal obtained by filtering the output signal, the second low-pass filter having a lower cut-off frequency than that of the first low-pass filter;

a second adder that outputs a second addition signal obtained by adding the input signal and a second inverted signal obtained by inverting a second feedback signal inputted to a second terminal;

a third low-pass filter that is fed with the second addition signal and outputs a signal obtained by filtering the second addition signal, as the second feedback signal to the second terminal;

a first control circuit that controls the gain of the variable gain amplifier circuit and the cut-off frequency of the first low-pass filter so as to keep constant a product of a transfer function of the variable gain amplifier circuit and a transfer function of the first low-pass filter; and a second control circuit that compares a level of the second feedback signal and a preset threshold value after completion of gain control of the variable gain amplifier circuit, the second control circuit inputting the signal outputted from the first low-pass filter, as the first feedback signal to the first terminal as long as the level of the second feedback signal is not lower than the threshold value, the second control circuit inputting the signal outputted from the second low-pass filter, as the first feedback signal to the first terminal when the level of the second feedback signal falls below the threshold value.

12. The radio receiver according to claim 11, wherein in the case where the level of the second feedback signal falls below the threshold value once after the completion of the gain control of the variable gain amplifier circuit, the second control circuit keeps inputting the signal outputted from the second low-pass filter, as the first feedback signal to the first terminal.

13. The radio receiver according to claim 12, wherein the third low-pass filter has a gain that is set equal to a gain of the first low-pass filter when the gain of the variable gain amplifier circuit is set at a minimum.

14. The radio receiver according to claim 12, further comprising a first switch element that is connected between the first terminal and an output of the first low-pass filter and is turned on/off by the second control circuit; and
a second switch element that is connected between the first terminal and an output of the second low-pass filter and is turned on/off by the second control circuit,
wherein the second control circuit turns on the first switch element and turns off the second switch element in the case where the level of the second feedback signal is higher than the threshold value, and
the second control circuit turns off the first switch element and turns on the second switch element in the case where the level of the second feedback signal is lower than the threshold value.

15. The radio receiver according to claim 12, wherein the third low-pass filter comprises:
a third resistor having a first end connected to a terminal fed with the second addition signal and a second end connected to a terminal for outputting the signal obtained by filtering the output signal; and
a second capacitor connected between the second end of the third resistor and ground.

16. The radio receiver according to claim 11, wherein the third low-pass filter has a gain that is set equal to a gain of the first low-pass filter when the gain of the variable gain amplifier circuit is set at a minimum.

17. The radio receiver according to claim 16, further comprising a first switch element that is connected between the first terminal and an output of the first low-pass filter and is turned on/off by the second control circuit; and
a second switch element that is connected between the first terminal and an output of the second low-pass filter and is turned on/off by the second control circuit,
wherein the second control circuit turns on the first switch element and turns off the second switch element in the case where the level of the second feedback signal is higher than the threshold value, and
the second control circuit turns off the first switch element and turns on the second switch element in the case where the level of the second feedback signal is lower than the threshold value.

18. The radio receiver according to claim 16, wherein the third low-pass filter comprises:
a third resistor having a first end connected to a terminal fed with the second addition signal and a second end connected to a terminal for outputting the signal obtained by filtering the output signal; and
a second capacitor connected between the second end of the third resistor and ground.

19. The radio receiver according to claim 11, further comprising a first switch element that is connected between the first terminal and an output of the first low-pass filter and is turned on/off by the second control circuit; and
a second switch element that is connected between the first terminal and an output of the second low-pass filter and is turned on/off by the second control circuit,
wherein the second control circuit turns on the first switch element and turns off the second switch element in the case where the level of the second feedback signal is higher than the threshold value, and
the second control circuit turns off the first switch element and turns on the second switch element in the case where the level of the second feedback signal is lower than the threshold value.

20. The radio receiver according to claim 11, wherein the third low-pass filter comprises:
a third resistor having a first end connected to a terminal fed with the second addition signal and a second end connected to a terminal for outputting the signal obtained by filtering the output signal; and
a second capacitor connected between the second end of the third resistor and ground.

* * * * *